United States Patent
Lee et al.

(10) Patent No.: US 8,427,195 B1
(45) Date of Patent: Apr. 23, 2013

(54) DIGITAL SIGNAL GENERATOR AND AUTOMATIC TEST EQUIPMENT HAVING THE SAME

(75) Inventors: Seong Kwan Lee, Suwon-si (KR); Hyun Woo Choi, Atlanta, GA (US); Sung Yeol Kim, Yogin-si (KR); David Keezer, Atlanta, GA (US); Carl Gray, Atlanta, GA (US); Te-Hui Chen, Atlanta, GA (US)

(73) Assignees: Samsung Electronics Co., Ltd., Gyeonggi-Do (KR); Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 13/468,668

(22) Filed: May 10, 2012

(51) Int. Cl.
*H03K 19/00* (2006.01)

(52) U.S. Cl.
USPC ............... 326/16; 326/52; 324/73.1; 714/738

(58) Field of Classification Search .................... 326/16, 326/52, 21; 324/73.1; 714/724, 728, 738, 714/739
See application file for complete search history.

(56) References Cited

U.S. PATENT DOCUMENTS

| | | | | |
|---|---|---|---|---|
| 6,636,979 | B1* | 10/2003 | Reddy et al. | 713/503 |
| 7,176,721 | B2* | 2/2007 | Ho et al. | 326/82 |
| 7,339,364 | B2* | 3/2008 | Kam et al. | 324/76.54 |
| 7,701,246 | B1* | 4/2010 | Plants et al. | 326/37 |

* cited by examiner

*Primary Examiner* — James H Cho

(74) *Attorney, Agent, or Firm* — Harness, Dickey & Pierce, P.L.C.

(57) ABSTRACT

A digital signal generator includes an input unit configured to receive signal information of a target data signal, a controller configured to calculate at least two delay values and at least two data values, the at least two delay values and the at least two data values being used to generate a data signal corresponding to the signal information input through the input unit, a multi-phase clock generator configured to delay a reference clock signal based on the at least two delay values to generate at least two clock signals having different phases, a signal generator configured to generate at least two data signals by assigning the at least two data values to the at least two clock signals, and a logic gate unit configured to generate the data signal corresponding to the signal information input through the input unit based on the at least two data signals.

15 Claims, 14 Drawing Sheets

DIGITAL SIGNAL GENERATOR AND AUTOMATIC TEST EQUIPMENT HAVING THE SAME

BACKGROUND

1. Field

Example embodiments relate to a digital signal generator which generates a data signal having signal information desired by a user.

2. Description of the Related Art

Generally, devices such as semiconductors are subject to a test process of electric properties after being manufactured to identify whether there is a problem with normal operation of the device. Such a test process is performed by semiconductor test equipment, which tests a semiconductor element using a probe card or a test socket.

Here, a semiconductor to be tested is called a Device Under Test (DUT). Automatic Test Equipment (ATE), mounting test equipment, fixed frequency mounted-type test equipment, etc. are used to test the DUT.

An ATE tests the DUT using a test pattern based on a defect model of a semiconductor IC obtained through previous experimentation. Such an ATE exhibits enhanced performance in detecting a logical failure and/or a parametric error.

Recently, products which are capable of actively varying an operating frequency of a semiconductor element have increased due to demand for low power and long-term use of electronic products, and semiconductor elements which achieve high-speed operation have been developed. Accordingly, semiconductor test equipment used to test defects of semiconductor elements according to a variable-frequency operation is demanded and a high-speed semiconductor test is also demanded.

To meet such requirements, a technique which arbitrarily sets a timing of a final output signal by changing a necessary delay value on a real-time basis using a variable signal delay circuit of a single channel has been developed. Such a variable signal delay circuit uses a Digital Delay Line (DDL) circuit or has a configuration adding a Delay Locked Loop (DLL) circuit to the DDL circuit.

However, since the variable signal delay circuit of a single channel has restrictions on a delay value reset speed thereof, the speed of a final generated timing signal is limited.

SUMMARY

Therefore, example embodiments provide a digital signal generator to generate a relatively high-speed data signal having a variable period desired by a user by using a commercial IC, and/or an ATE having the same.

Additional aspects of example embodiments will be set forth in part in the description which follows and, in part, will be obvious from the description, or may be learned from the below discussion of example embodiments.

In accordance with an example embodiment, a digital signal generator includes an input unit configured to receive signal information of a target data signal, a controller configured to calculate at least two delay values and at least two data values, the at least two delay values and the at least two data values being used to generate a data signal corresponding to the signal information input through the input unit, a multi-phase clock generator configured to delay a reference clock signal based on the at least two delay values to generate at least two clock signals having different phases, a signal generator configured to generate at least two data signals by assigning the at least two data values to the at least two clock signals generated from the multi-phase clock generator, and a logic gate unit configured to receive the at least two data signals and generate the data signal corresponding to the signal information input through the input unit based on the at least two data signals.

The multi-phase clock generator may include at least two delay elements connected in parallel with each other.

The signal generator may include at least two flip-flops connected in parallel with each other.

The logic gate unit may include at least two XOR gates having a tree structure connected in parallel with each other.

The flip-flops may be edge-triggered flip-flops, a state of each of which is changed at an edge of an input clock signal.

The signal information of the target data signal may include a length of a period, a location of an edge, and a data value at the edge within each period of the target data signal.

In accordance with another example embodiment, a digital signal generator includes an input unit configured to receive signal information of a target data signal, a controller configured to calculate a delay value and a data value, the delay value and the data value being used to generate a data signal corresponding to the signal information input through the input unit, a plurality of multi-phase clock generators configured to delay a reference clock signal in stages based on the delay value to generate at least two clock signals having different phases, a signal generator configured to generate at least two data signals by assigning the data value to the at least two clock signals, and a logic gate unit configured to receive the at least two data signals and generate the data signal corresponding to the signal information input through the input unit based on the at least two data signals.

The plurality of multi-phase clock generators may include a first multi-phase clock generator and a second multi-phase clock generator, wherein the first multi-phase clock generator is configured to first delay the reference clock signal and the second multi-phase clock generator is configured to delay the reference clock signal delayed by the first multi-phase clock generator.

Each of the first and second multi-phase clock generators may include at least two delay elements connected in parallel with each other.

The signal generator may include at least two flip-flops connected in parallel with each other.

The logic gate unit may include at least two XOR gates having a tree structure connected in parallel with each other.

The signal information of the target data signal may include a length of a period, a location of an edge, and a data value at the edge within each period of the target data signal.

The delay value calculated by the controller may cause a location of an edge of the data signal generated from the logic gate unit to correspond to a location of an edge of the signal information input through the input unit.

The data value calculated by the controller may cause a data value at an edge of the data signal generated from the logic gate unit to correspond to a data value of the signal information input through the input unit.

In accordance with an example embodiment, an Automatic Test Equipment (ATE) includes a digital signal generator.

The digital signal generator according to an example embodiment may generate a high-speed data signal having a variable period desired by a user with less costs by using a commercial IC which may be easily obtained.

The ATE according to an example embodiment may test a variety of types of DUTs through input of a data signal desired by a user to the DUT.

BRIEF DESCRIPTION OF THE DRAWINGS

These and/or other example embodiments will become apparent and more readily appreciated from the following description of example embodiments, taken in conjunction with the accompanying drawings of which.

DETAILED DESCRIPTION OF EXAMPLE EMBODIMENTS

Example embodiments will be understood more readily by reference to the following detailed description and the accompanying drawings. The example embodiments may, however, be embodied in many different forms and should not be construed as being limited to those set forth herein. Rather, these example embodiments are provided so that this disclosure will be thorough and complete.

It will be understood that when an element is referred to as being "connected to" or "coupled to" another element, it can be directly on, connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of example embodiments.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises," "comprising," "includes, and/or "including" when used in this specification, specify the presence of stated components, steps, operations, and/or elements, but do not preclude the presence or addition of one or more other components, steps, operations, elements, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
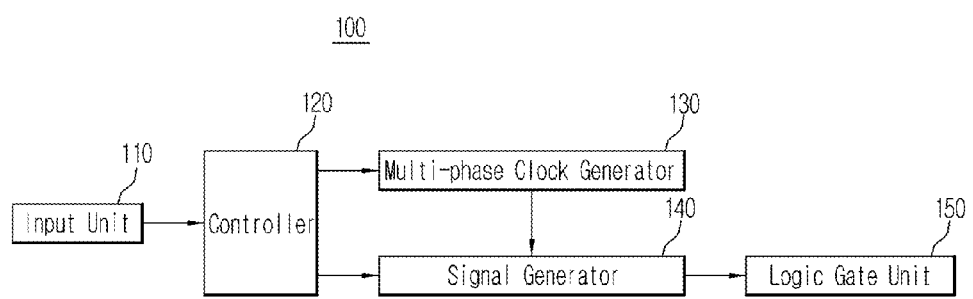
FIG. 1 is a control block diagram of a digital signal generator 100 according to an example embodiment.

FIG. 1 is a control block diagram of a digital signal generator 100 according to an example embodiment. Referring to FIG. 1, the digital signal generator 100 according to an example embodiment includes an input unit 110 configured to receive signal information about a data signal to be finally generated, a controller 120 configured to calculate at least two delay values and at least two data values, which are necessary to generate a data signal corresponding to the signal information input through the input unit 110, a multi-phase clock generator 130 configured to delay a reference clock signal based on the delay values calculated by the controller 120, a signal generator 140 configured to generate at least two data signals having the data values calculated by the controller 120, and a logic gate unit 150 configured to receive the at least two data signals generated from the signal generator 140 to generate a final data signal.

The input unit 110 receives signal information of a data signal to be finally generated. Here, the data signal to be finally generated may be input from a user. However, if necessary, the data signal may be autonomously generated by the controller 120 or may be input from another device connected to the digital signal generator 100. In this case, a separate input unit may be unnecessary.

Figure 2:
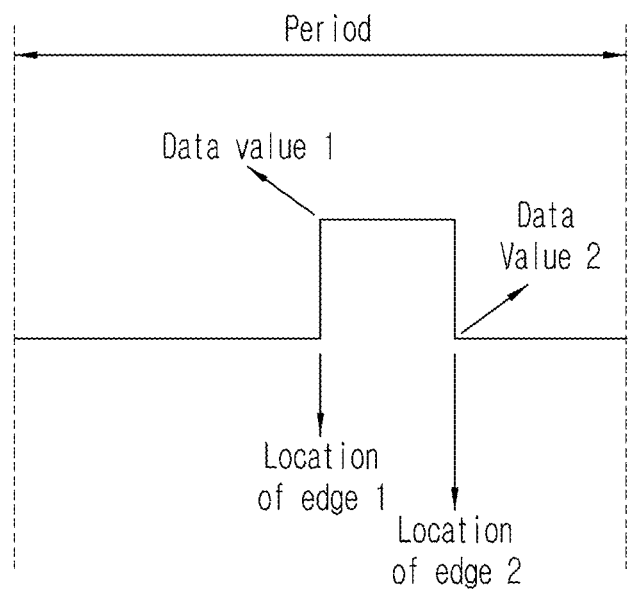
FIG. 2 is a timing diagram illustrating what is signal information of one period.

The signal information refers to information constituting a data signal within one period, i.e. information which can achieve a data signal of one period. In FIG. 2, a timing diagram illustrating signal information of one period is shown.

Referring to FIG. 2, signal information input by a user through the input unit 110 may include a period of a corresponding signal, locations of edges within a corresponding period, and data values (data value 1 and data value 2) at corresponding edges. The edges may include an ascending edge (edge 1) and a descending edge (edge 2).

The digital signal generator according to an example embodiment may generate a data signal having a variable period, and in this case, a user may input signal information with respect to different periods.

The input unit 110 may be implemented by a computer workstation which provides a user interface. However, the input unit 110 is not limited thereto and there is no limit to a device achieving the input unit 110 as long as the device has a configuration which can receive signal information from a user.

The multi-phase clock generator 130 delays an input reference clock signal according to at least two pre-calculated delay values to generate clock signals having two different phases.

The generated clock signals are input to the signal generator 140 and the signal generator 140 assigns pre-calculated data values to the input clock signal to generate at least two data signals.

The pre-calculated delay values used in the multi-phase clock generator 130 and the pre-calculated data values used in the signal generator 140 may be calculated by the controller 120.

The generated data signals are input to the logic gate unit 150 and the logic gate unit 150 generates one data signal having a variable period from the at least two data signals. The data signal having a variable period is a data signal corresponding to the signal information input through the input unit 110.

Hereinafter, the configuration and operation of the controller, multi-phase clock generator, signal generator and logic gate unit will be described in detail with reference to FIG. 3 to FIG. 6.

In an example embodiment described below, eight multi-phase clock signals are generated to output one data signal having a variable period.

Figure 3:
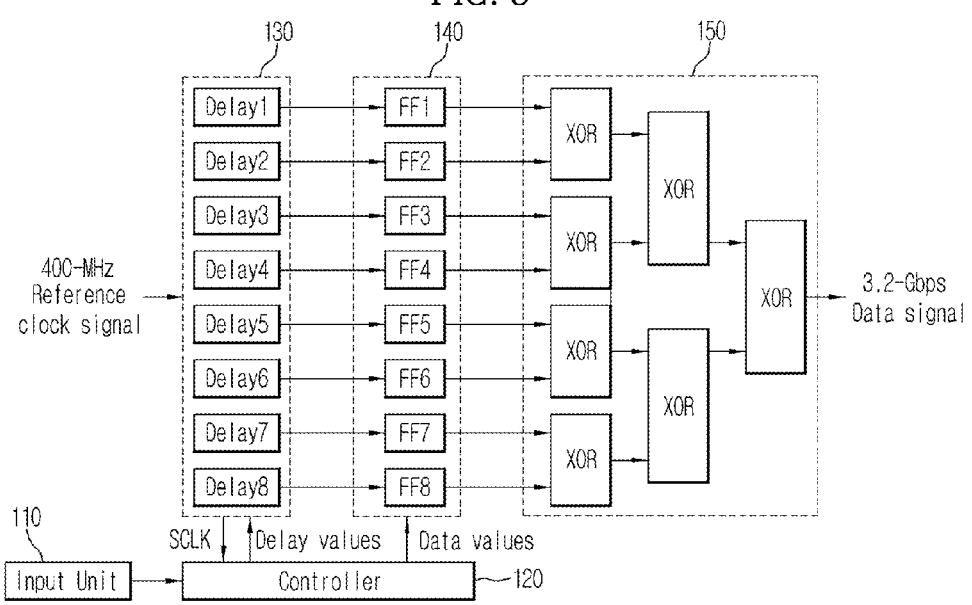
FIG. 3 is a schematic circuit diagram of the digital signal generator 100 according to an example embodiment.
Figure 4:
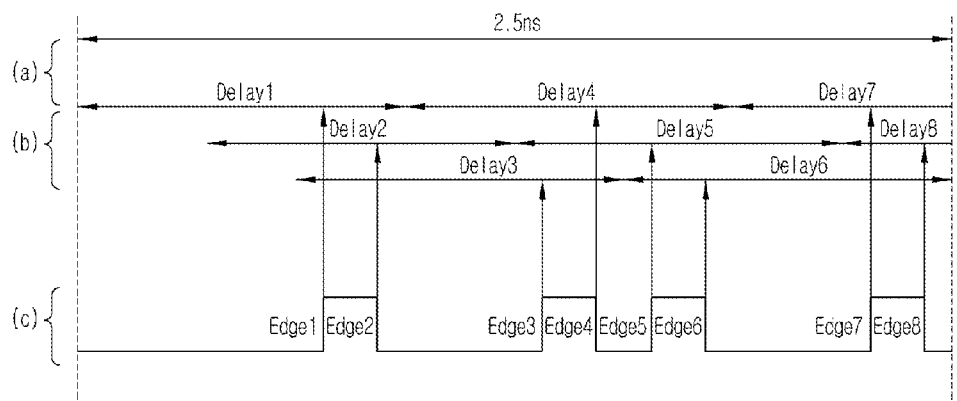
FIG. 4 is an operational timing diagram explaining a delay value calculation operation in the controller of the digital signal generator 100 according to an example embodiment.

FIG. 3 is a schematic circuit diagram of the digital signal generator 100 according to an example embodiment and FIG. 4 is an operational timing diagram explaining a delay value calculation operation in the controller 120 of the digital signal generator 100 according to an example embodiment.

Referring to FIG. 3, the digital signal generator 100 according to an example embodiment includes the multi-phase clock generator 130 including 8 delay elements Delay1 to Delay8 which are connected to each other in parallel, the signal generator 140 including 8 flip-flops FF1 to FF8 which are connected to each other in parallel, and the logic gate unit 150 including 7 XOR gates which are connected to each other in parallel to form a tree structure.

The controller 120 calculates delay values and data values to input the delay values and the data values to the multi-phase clock generator 130 and the signal generator 140, respectively. In an example embodiment, since the multi-phase clock generator 130 includes 8 delay elements to generate 8 multi-phase clock signals and the signal generator 140 includes 8 flip-flops, the controller 120 calculates 8 delay values and 8 data values.

A delay value calculation process of the controller 120 will now be described with reference to FIG. 4. To calculate delay values, the controller 120 assigns edges located within one period of a reference clock signal to eight delay elements which are in charge of zones to which the corresponding edges belong. Here, the edges mean edges of signal information input by a user.

A data signal corresponding to signal information input through the input unit is shown as a timing diagram in (c) of FIG. 4. Zones in which eight delay elements Delay1 to Delay8 perform a delay are shown in (b) of FIG. 4. If a reference clock signal input to the multi-phase clock generator 130 has a fixed frequency of 400 MHz (period of 2.5 ns) as shown in (a) of FIG. 4, the controller 120 assigns Edge1 to Delay1 and Edge2 to Delay2, and in the same manner, assigns Edge3 to Delay3 and Edge8 to Delay8, respectively.

As illustrated in FIG. 4, if a delay zone of which one delay element is in charge partially overlaps a delay zone of which another delay element is in charge, even though edges of a data signal are gathered in a narrow zone, the reference clock signal may be properly delayed by delay elements which are in charge of the corresponding zone.

The controller 120 calculates delay values so that the delay elements Delay1 to Delay8 may delay edges of the reference clock signal, especially, ascending edges up to locations of edges Edge1 to Edge8 of a data signal assigned thereto. Accordingly, the controller 120 calculates eight delay values corresponding to the eight delay elements and inputs the calculated delay values to corresponding delay elements.

In addition, the controller 120 performs encoding to calculate data values to be assigned to the multi-phase clock signals in the signal generator 140. Encoding is performed by the following [Equation 1].

$$E0 = C0 \text{ XOR } P1 \text{ XOR } P2 \text{ XOR } P3 \text{ XOR } P4 \text{ XOR } P5 \text{ XOR } P6 \text{ XOR } P7$$

$$E1 = C1 \text{ XOR } E0 \text{ XOR } P2 \text{ XOR } P3 \text{ XOR } P4 \text{ XOR } P5 \text{ XOR } P6 \text{ XOR } P7$$

$$E2 = C2 \text{ XOR } E0 \text{ XOR } E1 \text{ XOR } P3 \text{ XOR } P4 \text{ XOR } P5 \text{ XOR } P6 \text{ XOR } P7$$

$$E3 = C3 \text{ XOR } E0 \text{ XOR } E1 \text{ XOR } E2 \text{ XOR } P4 \text{ XOR } P5 \text{ XOR } P6 \text{ XOR } P7$$

$$E4 = C4 \text{ XOR } E0 \text{ XOR } E1 \text{ XOR } E2 \text{ XOR } E3 \text{ XOR } P5 \text{ XOR } P6 \text{ XOR } P7$$

$$E5 = C5 \text{ XOR } E0 \text{ XOR } D1 \text{ XOR } E2 \text{ XOR } E3 \text{ XOR } E4 \text{ XOR } P6 \text{ XOR } P7$$

$$E6 = C6 \text{ XOR } E0 \text{ XOR } E1 \text{ XOR } E2 \text{ XOR } E3 \text{ XOR } E4 \text{ XOR } E5 \text{ XOR } P7$$

$$E7 = C7 \text{ XOR } E0 \text{ XOR } E1 \text{ XOR } E2 \text{ XOR } E3 \text{ XOR } E4 \text{ XOR } E5 \text{ XOR } E7 \quad \text{[Equation 1]}$$

In [Equation 1], E denotes encoded data, C denotes a data value of a finally generated data signal, i.e. a data value input by a user, and P denotes a data value encoded in a previous period. The multi-phase clock signals input to the signal generator have a fixed frequency and encoding according to [Equation 1] is for one period of the clock signals.

In an example embodiment, if signal information input by a user through the input unit 110 corresponds to the data signal shown in (c) of FIG. 4, C which is a data value waveform of a finally generated data signal is 10101010 and P which is a data value waveform encoded in a previous period is 00000000. In this case, E calculated by the above [Equation 1] is 11111111, and data values input to the flip-flops of the signal generator 140 are all 1.

The controller 120 may be a logic circuit, for example, a Field Programmable Gate Array (FPGA), a Programmable Logic Device (PLD), a Complex Programmable Logic Device (CPLD), an Application-Specific Integrated Circuit (ASIC), etc. When the digital signal generator 100 according to an example embodiment is mounted in an ATE, such a logic circuit serves as an interface between the ATE and the digital signal generator 100.

Figure 5:
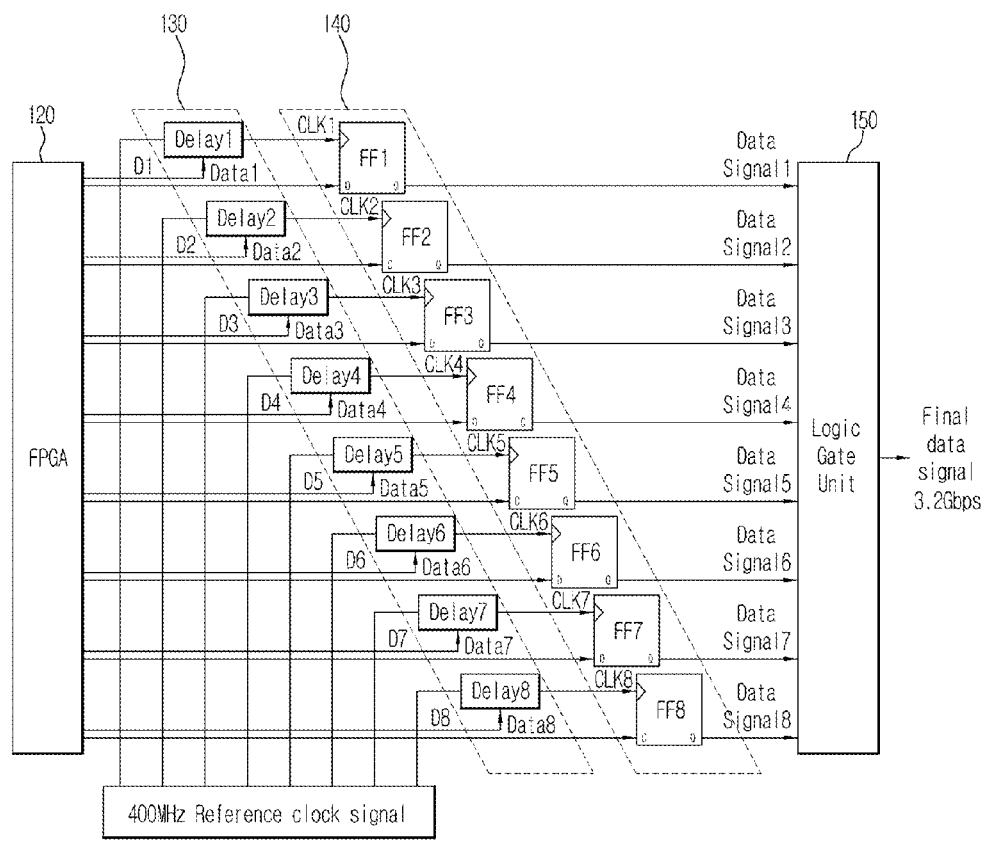
FIG. 5 is a detailed circuit diagram illustrating input and output relationships between the multi-phase clock generator 130, signal generator 140, and logic gate unit 150 of FIG. 1.
Figure 6:
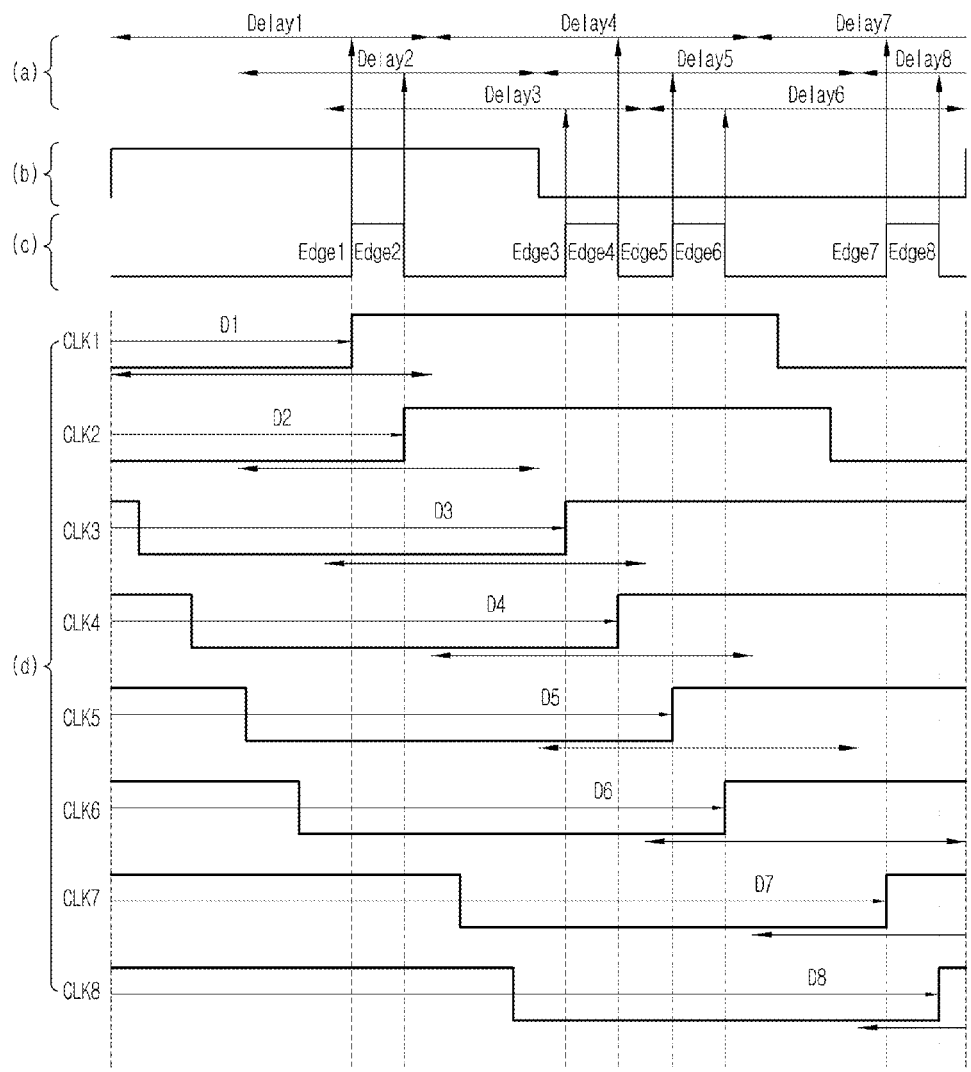
FIG. 6 is a timing diagram illustrating clock signals generated from the multi-phase clock generator 130 and input to the signal generator 140 of FIG. 5.
Figure 7:
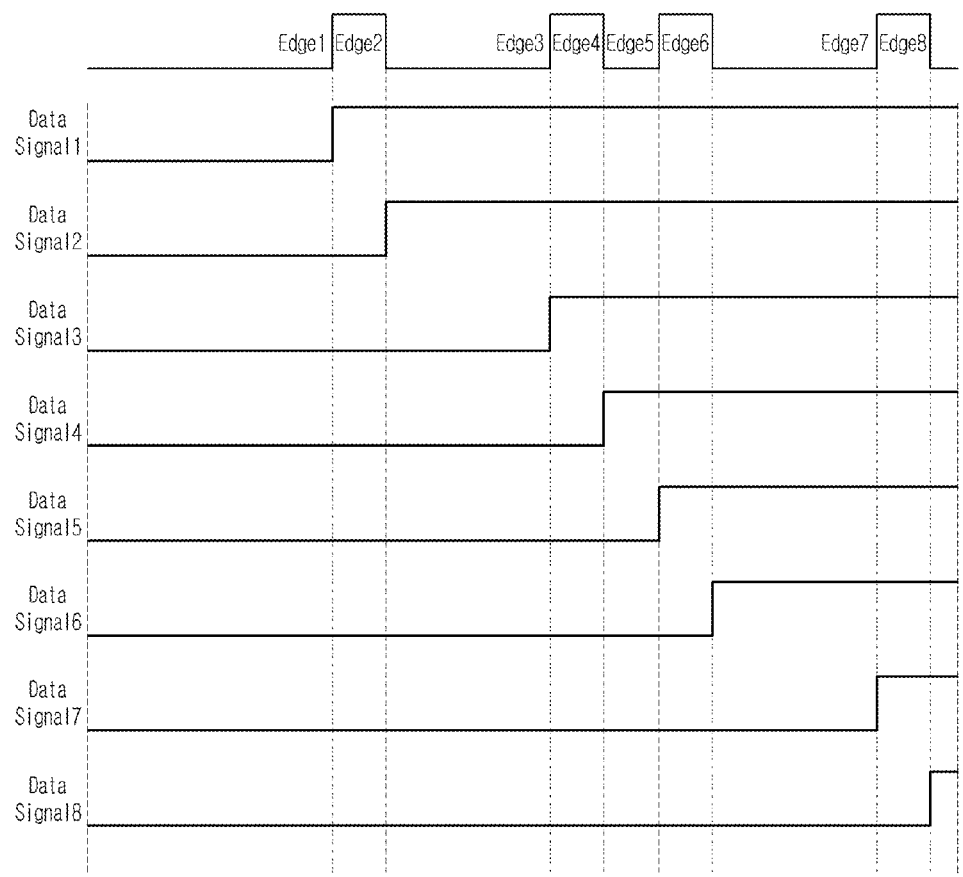
FIG. 7 is a timing diagram illustrating data signals generated from the signal generator 140 of FIG. 5.

FIG. 5 is a detailed circuit diagram illustrating input and output relationships between the multi-phase clock generator 130, signal generator 140, and logic gate unit 150 and FIG. 6 is a timing diagram illustrating clock signals generated from the multi-phase clock generator 130 and input to the signal generator 140. FIG. 7 is a timing diagram illustrating data signals generated from the signal generator 140.

Referring to FIG. 5, a reference clock signal having a fixed frequency is input to eight delay elements Delay1 to Delay8 of the multi-phase clock generator 13. In an example embodiment, the reference clock signal has a fixed frequency of 400 MHz.

If delay values D1 to D8 calculated in the controller 120 comprised of an FPGA are input to corresponding delay elements Delay1 to Delay8, the respective delay elements delay the input reference clock signal by delay values D1 to D8 to generate clock signals CLK1 to CLK8.

Referring to FIG. 6, if one period of the reference clock signal is as shown in (b) of FIG. 6, time zones of which the delay elements Delay1 to Delay8 are in charge within one period are as shown in (a) of FIG. 6, and signal information input through the input unit 110 is as shown in (c) of FIG. 6, the respective delay elements of the multi-phase clock generator 130 delay the reference clock signal to generate multi-phase clock signals CLK1 to CLK8 as shown in (d) of FIG. 6

In more detail, in (d) of FIG. 6, the delay element Delay1 of the multi-phase clock generator 130 delays the reference clock signal by the delay value D1 calculated in the controller 120 to shift an ascending edge of the reference clock signal up to a location of an edge Edge1 of a data signal assigned to the delay element Delay1.

The delay element Delay2 delays the reference clock signal by the delay value D2 calculated in the controller 120 to shift an ascending edge of the reference clock signal up to a location of an edge Edge2 of a data signal assigned to the delay element Delay2.

The delay element Delay3 delays the reference clock signal by the delay value D3 calculated in the controller 120 to shift an ascending edge of the reference clock signal up to a location of an edge Edge3 of a data signal assigned to the delay element Delay3.

The delay element Delay4 delays the reference clock signal by the delay value D4 calculated in the controller 120 to shift an ascending edge of the reference clock signal up to a location of an edge Edge4 of a data signal assigned to the delay element Delay4.

The delay element Delay5 delays the reference clock signal by the delay value D5 calculated in the controller 120 to shift an ascending edge of the reference clock signal up to a location of an edge Edge5 of a data signal assigned to the delay element Delay5.

The delay element Delay6 delays the reference clock signal by the delay value D6 calculated in the controller 120 to shift an ascending edge of the reference clock signal up to a location of an edge Edge6 of a data signal assigned to the delay element Delay6.

The delay element Delay7 delays the reference clock signal by the delay value D7 calculated in the controller 120 to shift an ascending edge of the reference clock signal up to a location of an edge Edge7 of a data signal assigned to the delay element Delay7.

The delay element Delay8 delays the reference clock signal by the delay value D8 calculated in the controller 120 to shift an ascending edge of the reference clock signal up to a location of an edge Edge8 of a data signal assigned to the delay element Delay8.

Thus, the delay elements Delay1 to Delay8 generate clock signals CLK1 to CLK8, an ascending edge of each of which is located at a target edge.

Referring back to FIG. 5, the eight clock signals CLK1 to CLK8 having different phases, generated from the delay elements of the multi-phase clock generator 130, are input to flip-flops FF1 to FF8 of the signal generator 140.

In an example embodiment, D flip-flops, a state Q of each of which is determined according to an input D at an edge of a clock signal, are used. In the controller 120 and the multi-phase clock generator 130 of the above-described example embodiment, since a state of a data signal is determined according to an input value at an ascending edge of a clock signal, ascending edge D flip-flops are used herein.

In more detail, the clock signal CLK1 generated from the delay element Delay1 and a data value Data1 calculated in the controller 120 are input to the flip-flop FF1, and the clock signal CLK2 generated from the delay element Delay2 and a data value Data2 calculated in the controller 120 are input to the flip-flop FF2. In this way, the clock signals CLK3 to CLK8 and data values Data3 to Data8 are input to the flip-flops FF3 to FF8.

If the clock signals and the data values are input to the respective flip-flops, then the flip-flops generate data signals having both timing information and data information (or state information). Since a data value of a digital signal is expressed as a state 0 or 1, the terms data information and state information may be used interchangeably hereinafter.

If the reference clock signal, the time zones of which the delay elements are in charge, and the signal information input through the input unit 110 are as shown in (b), (a), and (c) of FIG. 6, the clock signals input to the respective flip-flops of the signal generator 140 are as shown in (d) of FIG. 6, and the data values Data1 to Data8 input to the respective flip-flops of the signal generator 140 are all 1.

Data signals generated by the flip-flops of the signal generator 140 are as shown in FIG. 7. Referring to FIG. 7, a data signal Data Signal1 generated by the flip-flop FF1 has a state 1 after an edge Egde1 within a fixed period of 2.5 ns and a data signal Data Signal2 generated by the flip-flop FF2 has a state 1 after an edge Egde2. Similarly, data signals Data Signal3 to Data Signal8 generated by the flip-flops FF3 to FF8 have a state 1 after edges Egde3 to Edge8, respectively.

The data signals Data Signal1 to Data Signal8 generated by the flip-flops FF1 to FF8 of the signal generator 140 are input to the logic gate unit 150 as shown in FIG. 5. According to a basic principle of a logic gate unit comprised of an XOR gate which generates a state 1 when two input signals are equal and generates a state 0 when two input signals are different, the logic gate unit 150 generates a final data signal corresponding to the signal information input through the input unit 110, i.e. a data signal as shown in (c) of FIG. 6.

The logic gate unit 150 includes at least seven XOR gates connected to each other in parallel as a tree structure. The logic gate unit 150 passes input data signals through multiple stages and serves to combine all data signals with different timings into one signal.

A multiplexer (MUX) having eight inputs may be used instead of the XOR gates of the logic gate unit 150. However, when the XOR gates are used, signals may be generated at faster speed because no switching time is needed.

When a frequency of the reference clock signal is 400 MHz, although each data signal input to the logic gate unit via the signal generator has a speed of 400 Mps, one data signal finally generated through the logic gate unit has a speed of 3.2 Gbps. Namely, when generating signals using the digital signal generator 100 in accordance with an example embodiment, a digital signal which is faster than a speed of an input signal by the number of delay elements may be generated.

Hereinafter, a digital signal generator according to another example embodiment will be described.

Figure 8:
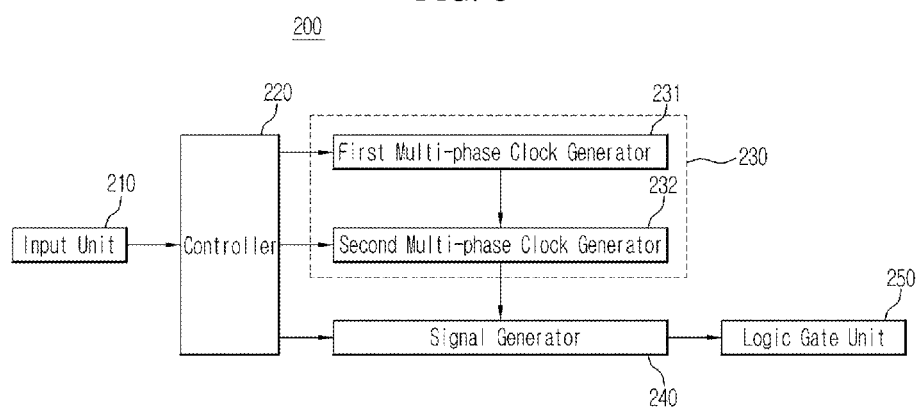
FIG. 8 is a control block diagram of a digital signal generator 200 according to another example embodiment.

FIG. 8 is a control block diagram of a digital signal generator 200 according to another example embodiment.

Referring to FIG. 8, the digital signal generator 200 according to another example embodiment includes an input unit 210 configured to receive signal information about a data signal to be finally generated, a controller 220 configured to calculate at least two delay values and at least two data values, which are necessary to generate a data signal corresponding to the signal information input through the input unit 210, a multi-phase clock generator 230 configured to delay a reference clock signal in stages based on the delay values calculated by the controller 220 to generate at least two clock signals, a signal generator 240 configured to generate at least two data signals having the data values calculated by the controller 120, and a logic gate unit 250 configured to receive the at least two data signals generated from the signal generator 240 to generate a final data signal.

The digital signal generator 200 of FIG. 8 according to another example embodiment is different from the digital signal generator 100 of FIG. 1 in that the multi-phase clock generator 230 includes a first multi-phase clock generator 231 and a second multi-phase clock generator 232 to delay the reference clock signal by stages. Accordingly, the delay values calculated by the controller 220 and the clock signals generated from the multi-phase clock generator 230 are different from the values calculated by the controller 120 in FIG. 1.

The input unit 210 receives signal information of a data signal to be finally generated from a user or another device, as in the above described example embodiment. The signal information includes a period, locations of edges, and data values at edges. In an example embodiment, a separate input unit may also be unnecessary and it is possible to autonomously generate the data signal in the controller.

Figure 9:
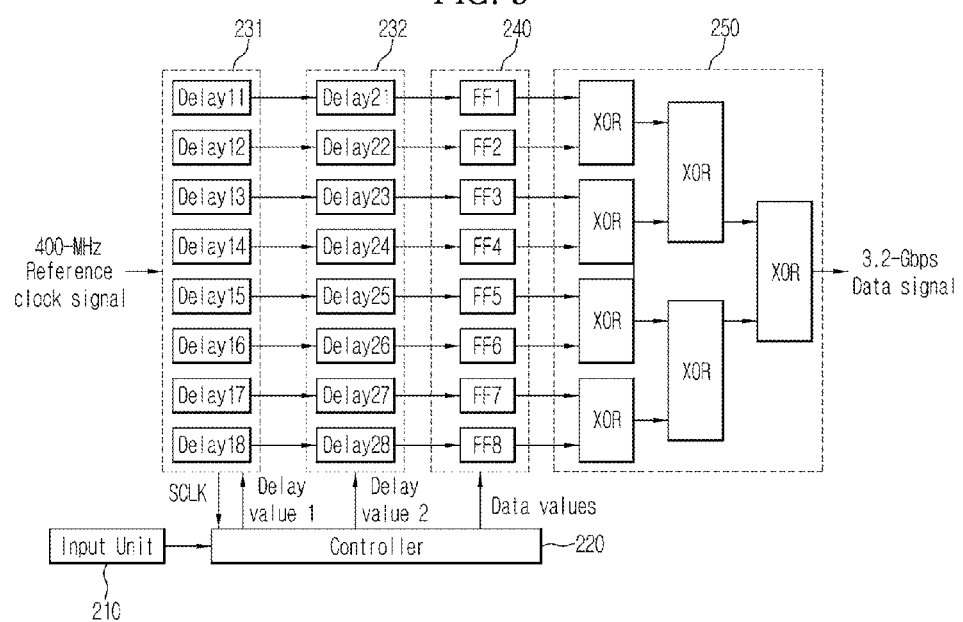
FIG. 9 is a schematic circuit diagram of the digital signal generator 200 according to another example embodiment.

FIG. 9 is a schematic circuit diagram of the digital signal generator 200 according to another example embodiment. As in the above described example embodiment, one final data signal is generated using eight clock signals.

Referring to FIG. 9, each of the first and second multi-phase clock generators 231 and 232 of the digital signal generator 200 according to another example embodiment includes eight delay elements connected to each other in parallel. The signal generator 240 includes eight flip-flops connected to each other in parallel, and the logic gate unit 250 includes seven XOR gates connected to each other in parallel to form a tree structure.

If a reference clock signal SCLK is input to the first multi-phase clock generator 231, then delay elements Delay11 to Delay18 of the first multi-phase clock generator 231 delay the reference clock signal to shift an ascending edge of the reference clock signal to start points of zones of which delay elements Delay21 to Delay28 of the second multi-phase clock generator 232 are in charge. This will be described in detail with reference to FIG. 10.

Figure 10:
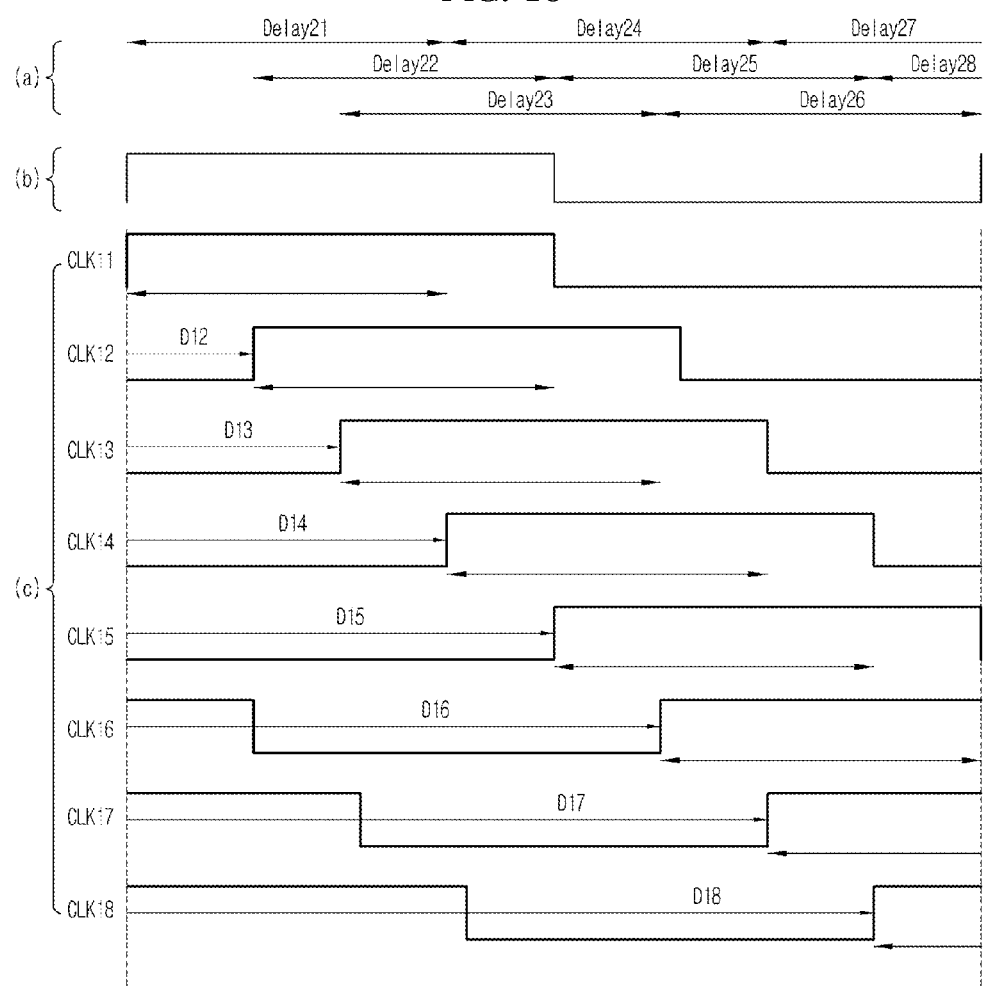
FIG. 10 is a timing diagram illustrating clock signals generated from the first multi-phase clock generator 231 of the digital signal generator 200 according to another example embodiment.

FIG. 10 is a timing diagram illustrating clock signals generated from the first multi-phase clock generator 231 of the digital signal generator 200 according to another example embodiment.

If an input reference clock signal is as shown in (b) of FIG. 10 and zones of which the delay elements Delay21 to Delay28 are in charge are as shown in (a) of FIG. 10, then the first multi-phase clock generator 231 delays the reference clock signal to generate eight clock signals CLK11 to CLK18 having different phases as shown in (c) of FIG. 10.

More specifically, the delay element Delay11 delays the reference clock signal by a delay value D11 so that an ascending edge of the reference clock signal may be located at a start point of a zone of which the delay element Delay21 is in charge. The delay element Delay21 delays the reference clock signal by a delay value D21 so that an ascending edge of the reference clock signal may be located at a start point of a zone of which the delay element Delay21 is in charge. In this way, the delay elements Delay11 to Delay18 delay the reference clock signal by delay values D11 to D18.

The delay values D11 to D18 may be calculated in the controller 220. As in the above example embodiment, if the first multi-phase clock generator 231 delays the reference clock signal before the second multi-phase clock generator 232 delays the reference clock signal up to a target edge location, then the reference clock signal may be more precisely delayed compared with the case where one delay is performed.

Figure 11:
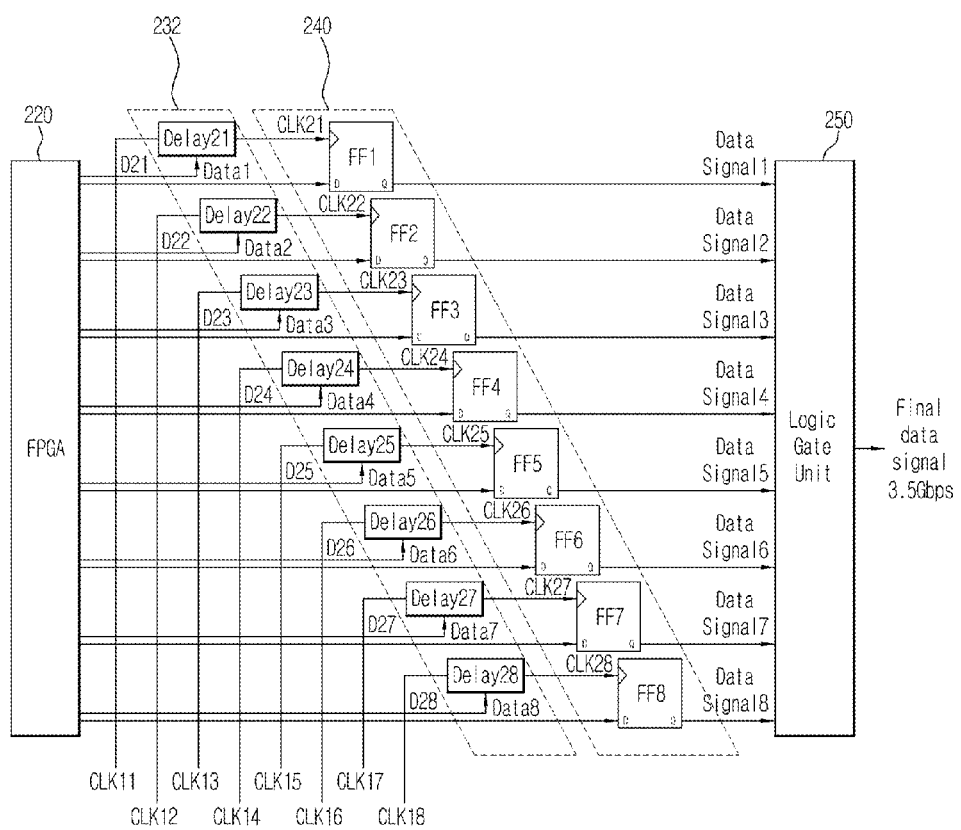
FIG. 11 is a detailed circuit diagram illustrating input and output relationships between the second multi-phase clock generator 232, signal generator 240, and logic gate unit 250 of the digital signal generator 200 according to another example embodiment.

FIG. 11 is a detailed circuit diagram illustrating input and output relationships between the second multi-phase clock generator 232, signal generator 240, and logic gate unit 250 of the digital signal generator 200 according to another example embodiment.

Referring to FIG. 11, the clock signals CLK11 to CLK18 generated by the first multi-phase clock generator 231 are respectively input to the delay elements Delay21 to Delay28 of the second multi-phase clock generator 232, and clock signals CLK21 to CLK28 generated by the delay elements Delay21 to Delay28 are respectively input to the flip-flops FF1 to FF8 of the signal generator 240.

Delay values D21 to D28 calculated in the controller 220 are respectively input to the delay elements Delay21 to Delay28 of the second multi-phase clock generator 232. A delay value calculation method in the controller 220 is as described in the above example embodiment of the digital signal generator 100.

However, in another example embodiment, the delay values D11 to D18 are calculated to shift an original location of the reference clock signal to start points of the zones of which the delay elements Delay21 to Delay28 are in charge, and the delay values D21 to D28 are calculated to shift the start points of the zones of which the delay elements Delay21 to Delay28 are in charge to target edge locations.

The delay values D11 to D18 are not necessarily used to shift the edge location of the reference clock signal to start points of the zones of which the delay elements Delay21 to Delay28 are in charge. For example, delay values D11 to D18 may be used to shift the edge location of the reference clock signal to arbitrary locations prior to the target edge locations. In this case, the delay values D21 to D28 are used to shift the edge of the reference clock signal from the arbitrary locations to target edge locations.

Figure 12:
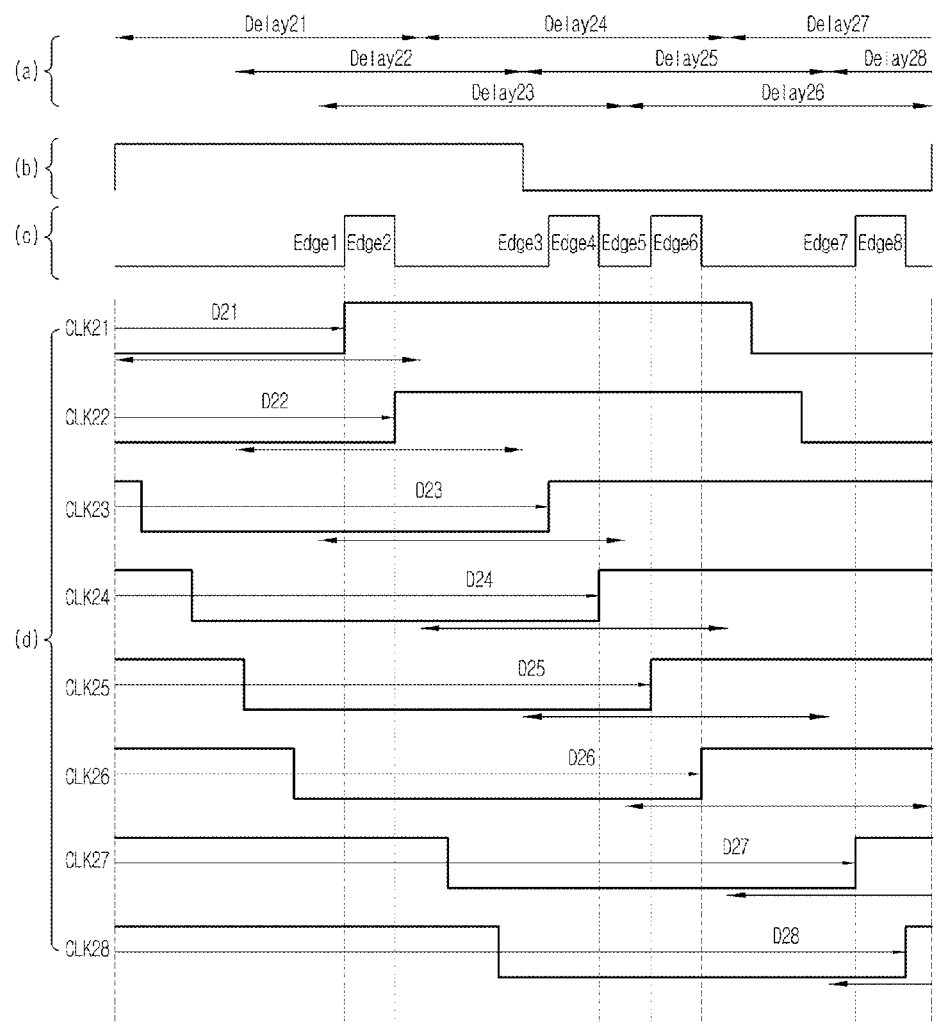
FIG. 12 is a timing diagram illustrating a clock signal generated from the second multi-phase clock generator 232 of the digital signal generator 200 according to another example embodiment.

FIG. 12 is a timing diagram illustrating a clock signal generated from the second multi-phase clock generator 232 of the digital signal generator 200 according to another example embodiment.

Time zone of which the delay elements Delay21 to Delay28 are in charge, shown in (a) of FIG. 12, a reference clock signal shown in (b) of FIG. 12, and a final data signal shown in (c) of FIG. 12 are the same as those of FIG. 10.

Because the clock signals input to the delay elements Delay21 to Delay28 correspond to signals obtained by shifting the ascending edge of the reference clock signal up to start points of the zone of which the delay elements Delay21 to Delay28 are in charge in the first multi-phase clock generator 231, the delay elements Delay21 to Delay28 shift the input clock signals up to target edge locations Edge1 to Edge8 from the starting points according to the delay values D21 to D28.

Accordingly, the clock signals CLK21 to CLK28 generated from the second multi-phase clock generator 232 of this embodiment may be the same as the clock signals CLK1 to CLK8 generated from the multi-phase clock generator 130 of the previously described example embodiment.

Namely, the clock signals input to the signal generator may be the same as those in the previously described example embodiment. However, in another example embodiment, the reference clock signal is first delayed by a minimum delay value of each of the delay elements Delay21 to Delay28 and then is further delayed up to a target location. Therefore, inaccuracy generated due to a one-time delay may be reduced (or alternatively, prevented), and time delay may be more precisely performed.

Delay corresponding to the minimum delay value of each of the delay elements Delay21 to Delay28 is simply one example embodiment, and any arbitrary delay values may be the delay values D11 to D18 used to first delay the reference clock signal in the multi-phase clock generator.

When shifting the edge location of the reference clock signal to a target edge location, the multi-phase clock generator 230 may further reduce inaccuracies by performing more than two stages of time delay. For example, the multi-phase clock generator 230 may include a first multi-stage clock generator to an n-th multi-phase clock generator, where n may be determined in consideration of factors such as degree of precision and manufacturing costs of the digital signal generator.

Similar to the above described example embodiment, the controller 220 calculates data values assigned to clock signals in the signal generator 240 and a data value calculation method may be the same as in the above example embodiment.

Referring back to FIG. 11, if the data values Data1 to Data8 calculated in the controller 220 comprised of an FPGA and the clock signals CLK21 to CLK28 generated from the second multi-phase clock generator 232 are input to the signal generator 240, the flip-flops FF1 to FF8 of the signal generator 240 generate data signals Data Signal1 to Data Signal8 including both timing information and data information.

The generated data signals are input to the logic gate unit 250 comprised of XOR gates where a final data signal corresponding to the signal information input through the input unit 210 is generated. That is, a data signal desired by a user is generated.

To this end, the logic gate unit 250 in this embodiment has a parallel tree structure of XOR gates. A MUX may be used instead of the logic gate unit 250. However, use of the XOR gates may improve a signal generation speed because a switching time is not required.

In an example embodiment, if a reference clock signal of 400 MHz is input, then a data signal having a speed of 3.2 Gbps, which is eight times faster than the input signal, may be generated.

In example embodiments described up to now, while ascending edge D flip-flops have been used as elements constituting the signal generators 140 and 240, this is purely exemplary. For example, descending edge D flip-flops, states of which are changed at descending edges of a clock signal, and/or SR flip-flops, output states of which are determined according to the states of S and R at ascending edges or descending edges of a clock signal may be used. Further still, JK flip-flops, output states of which are determined according to the states of J and K at ascending edges or descending edges of a clock signal, and/or T flip-flops may be used.

In addition, double edge flip-flops, states of which are changed at both ascending edges and descending edges of a clock signal may be used. If the double edge flip-flops are used, a data signal having a speed twice that of the data signal in the above example embodiments may be generated. In other words, if it is desired to generate a data signal of 3.2 Gbps through input of a reference clock signal of 400 MHz, although the 8-channel signal delay circuit has been used in the above embodiments, a 4-channel signal delay circuit may be used when the double edge flip-flops are used.

Meanwhile, if elements other than the ascending edge D flip-flops are used as elements constituting the signal generators 140 and 240, then the delay values and the data values calculated in the controllers 120 and 220 should be correspondingly varied.

Figure 13:
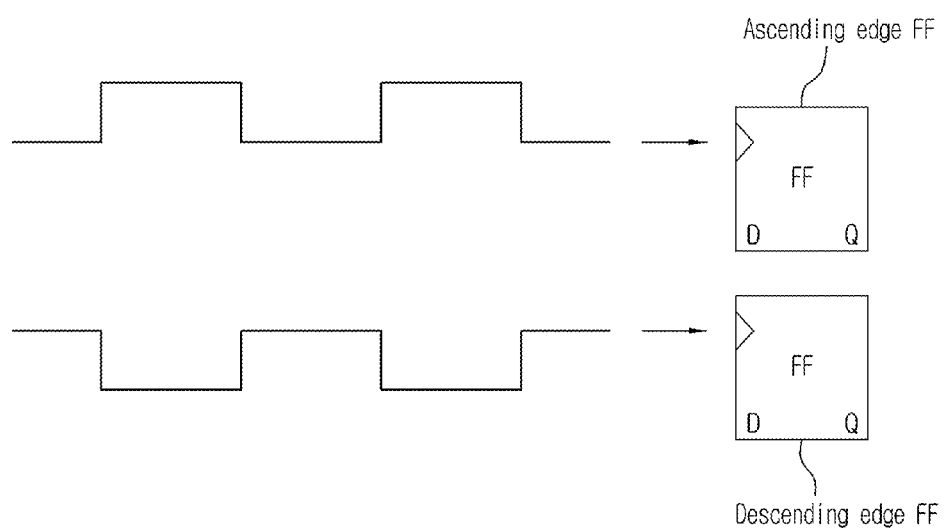
FIG. 13 is a timing diagram illustrating phases of clock signals input to flip-flops upon using an ascending edge D flip-flop and using a descending edge D flip-flop in an example embodiment.

FIG. 13 is a timing diagram illustrating phases of clock signals input to flip-flops upon using an ascending edge D flip-flop and using a descending edge D flip-flop in an example embodiment.

For example, if a descending edge D flip-flop is used in the signal generator, a phase of a clock signal input to the signal generator should be opposite to that when an ascending edge D flip-flop is used as shown in FIG. 13.

Since the location of a target edge is the same, this may be achieved by causing a descending edge of a clock signal input to a descending edge D flip-flop to be located at an ascending edge of a clock signal input to an ascending edge D flip-flop.

Accordingly, the controllers 120 and 220 may calculate delay values to shift a descending edge of a reference clock signal to a target edge location.

Figure 14:
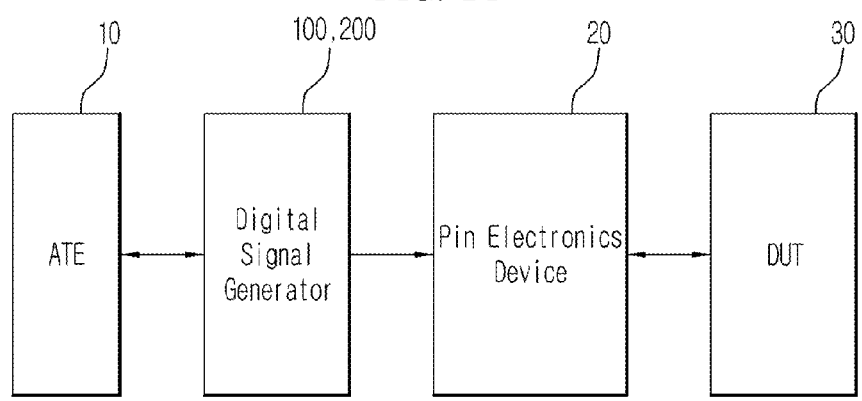
FIG. 14 is a schematic control block diagram of an ATE including the digital signal generator 100 or 200 according to an example embodiment.

FIG. 14 is a schematic control block diagram of an ATE including the digital signal generator 100 or 200 according to an example embodiment.

As shown in FIG. 14, the digital signal generators 100 and 200 according to the example embodiments may be mounted in an ATE 10 to cause the ATE 10 to electrically test a DUT 30. The DUT 30 may be a semiconductor element. However, the DUT 30 is not limited thereto and may be various electronic elements.

If the DUT 30 is a semiconductor element, an electric test may find defects generated during a wafer production process or an assembly process, eliminate defective products, and identify products having no defects.

The digital signal generator 100 or 200 is not necessarily mounted in the ATE 10 and the digital signal generator 100 or 200 may be electrically connected to the ATE 10 using the controller comprised of an FPGA, for example, as an interface.

The digital signal generated according to the above-mentioned example embodiments is a test signal and is input to a DUT 30 through a pin electronics device 20. The DUT 30 generates a test result signal so that the ATE 10 may determine whether the DUT 30 is defective or not. The pin electronics device 20 may include a driver and a comparator.

The digital signal generator according to the above-described example embodiments may generate a high-speed data signal having a variable period desired by a user with less costs by using a commercial IC which may be easily obtained.

In addition, the ATE according to at least one example embodiment may test a variety of types of DUTs though input of a data signal desired by a user to the DUT.

Although some example embodiments have been shown and described, it would be appreciated by those skilled in the art that changes may be made in these example embodiments without departing from the spirit and scope of the claims and their equivalents.

What is claimed is:

1. A digital signal generator comprising:
   an input unit configured to receive signal information of a target data signal;
   a controller configured to calculate at least two delay values and at least two data values, the at least two delay values and the at least two data values being used to generate a data signal corresponding to the signal information input through the input unit;

a multi-phase clock generator configured to delay a reference clock signal based on the at least two delay values to generate at least two clock signals having different phases;

a signal generator configured to generate at least two data signals by assigning the at least two data values to the at least two clock signals; and a logic gate unit configured to receive the at least two data signals and generate the data signal corresponding to the signal information input through the input unit based on the at least two data signals.

2. The digital signal generator according to claim 1, wherein the multi-phase clock generator includes at least two delay elements connected in parallel with each other.

3. The digital signal generator according to claim 1, wherein the signal generator includes at least two flip-flops connected in parallel with each other.

4. The digital signal generator according to claim 1, wherein the logic gate unit includes at least two XOR gates having a tree structure connected in parallel with each other.

5. The digital signal generator according to claim 3, wherein the flip-flops are edge-triggered flip-flops, a state of each of which is changed at an edge of an input clock signal.

6. The digital signal generator according to claim 1, wherein the signal information of the target data signal includes a length of a period, a location of an edge, and a data value at the edge within each period of the target data signal.

7. A digital signal generator comprising:

an input unit configured to receive signal information of a target data signal;

a controller configured to calculate a delay value and a data value, the delay value and the data value being used to generate a data signal corresponding to the signal information input through the input unit;

a plurality of multi-phase clock generators configured to delay a reference clock signal in stages based on the delay value to generate at least two clock signals having different phases;

a signal generator configured to generate at least two data signals by assigning the data value to the at least two clock signals; and a logic gate unit configured to receive the at least two data signals and generate the data signal corresponding to the signal information input through the input unit based on the at least two data signals.

8. The digital signal generator according to claim 7, wherein the plurality of multi-phase clock generators includes a first multi-phase clock generator and a second multi-phase clock generator, and the first multi-phase clock generator is configured to first delay the reference clock signal and the second multi-phase clock generator is configured to delay the reference clock signal delayed by the first multi-phase clock generator.

9. The digital signal generator according to claim 8, wherein each of the first and second multi-phase clock generators includes at least two delay elements connected in parallel with each other.

10. The digital signal generator according to claim 7, wherein the signal generator includes at least two flip-flops connected in parallel with each other.

11. The digital signal generator according to claim 7, wherein the logic gate unit includes at least two XOR gates having a tree structure connected in parallel with each other.

12. The digital signal generator according to claim 7, wherein the signal information of the target data signal includes a length of a period, a location of an edge, and a data value at the edge within each period of the target data signal.

13. The digital signal generator according to claim 12, wherein the delay value calculated by the controller causes a location of an edge of the data signal generated from the logic gate unit to correspond to a location of an edge of the signal information input through the input unit.

14. The digital signal generator according to claim 13, wherein the data value calculated by the controller causes a data value at an edge of the data signal generated from the logic gate unit to correspond to a data value of the signal information input through the input unit.

15. An Automatic Test Equipment (ATE) including the digital signal generator of claim 1.

* * * * *